(12) United States Patent
Ooshiro et al.

(10) Patent No.: US 9,475,702 B2
(45) Date of Patent: Oct. 25, 2016

(54) METHOD FOR PRODUCING GRAPHITE SHEET

(71) Applicant: PANASONIC CORPORATION, Osaka (JP)

(72) Inventors: Tatsuhiro Ooshiro, Hokkaido (JP); Norihiro Kawamura, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 289 days.

(21) Appl. No.: 14/372,700

(22) PCT Filed: Mar. 5, 2013

(86) PCT No.: PCT/JP2013/001350
§ 371 (c)(1),
(2) Date: Jul. 16, 2014

(87) PCT Pub. No.: WO2013/140724
PCT Pub. Date: Sep. 26, 2013

(65) Prior Publication Data
US 2014/0332993 A1    Nov. 13, 2014

(30) Foreign Application Priority Data

Mar. 22, 2012  (JP) ................. 2012-065003

(51) Int. Cl.
*C01B 31/04* (2006.01)
*H01L 23/373* (2006.01)

(52) U.S. Cl.
CPC .......... *C01B 31/04* (2013.01); *H01L 23/373* (2013.01); *H01L 2924/0002* (2013.01)

(58) Field of Classification Search
CPC ................. H01L 23/373; H01L 2924/0002; H01L 23/3737; H01L 51/0037; Y10T 428/30; B32B 9/007; C01B 31/04
See application file for complete search history.

(56) References Cited

U.S. PATENT DOCUMENTS

| 3,998,689 A | 12/1976 | Kitago et al. |
| 4,395,514 A * | 7/1983 | Edelman ............ C08G 73/1021 428/408 |

(Continued)

FOREIGN PATENT DOCUMENTS

| CN | 1910722 | 2/2007 |
| CN | 102302800 | 1/2012 |

(Continued)

OTHER PUBLICATIONS

English Translation of Chinese Search Report dated Aug. 5, 2015 for the related Chinese Patent Application No. 201380015681.2.

(Continued)

*Primary Examiner* — Jodi C Franklin
(74) *Attorney, Agent, or Firm* — McDermott Will & Emery LLP

(57) ABSTRACT

With a manufacturing method of a graphite sheet, a cavity-forming sheet having a mesh structure or a nonwoven fabric structure is firstly impregnated with polyamide acid and then molded into a sheet. The molded sheet is then heat treated to imidize polyamide acid so as to produce a polyimide sheet composed of polyimide and the cavity-forming sheet disposed in polyimide. The polyimide sheet is then fired in a non-oxidizing atmosphere to pyrolyze the polyimide so as to produce the graphite sheet. The cavity-forming sheet is made of material which maintains a shape thereof when the polyimide sheet is produced and which gasifies and loses at least 80% of its weight when the polyimide is pyrolyzed.

7 Claims, 1 Drawing Sheet

(56) References Cited

U.S. PATENT DOCUMENTS

| | | | | |
|---|---|---|---|---|
| 4,619,796 A | * | 10/1986 | Awata | H01M 4/96 162/145 |
| 5,698,341 A | * | 12/1997 | Tamaki | C01B 31/04 423/275 |
| 5,846,459 A | * | 12/1998 | Mercuri | C04B 35/536 264/105 |
| 8,916,239 B2 | * | 12/2014 | Weng | C01B 31/04 427/350 |
| 9,240,394 B1 | * | 1/2016 | Ben Jamaa | H01L 25/50 |
| 9,267,745 B2 | * | 2/2016 | Southard, II | B32B 18/00 |
| 2002/0197476 A1 | * | 12/2002 | Mercuri | C01B 31/0415 428/408 |
| 2005/0184635 A1 | | 8/2005 | Taomoto et al. | |
| 2006/0062983 A1 | * | 3/2006 | Irvin | B82Y 10/00 428/220 |
| 2006/0279192 A1 | | 12/2006 | Taomoto et al. | |
| 2008/0050305 A1 | * | 2/2008 | Nishikawa | C01B 31/04 423/448 |
| 2009/0311510 A1 | * | 12/2009 | Ogawa | B29C 43/04 428/320.2 |
| 2010/0196716 A1 | * | 8/2010 | Ohta | C01B 31/04 428/408 |
| 2011/0045300 A1 | * | 2/2011 | Tamaoki | C01B 31/04 428/408 |
| 2011/0171377 A1 | * | 7/2011 | Mues | B01D 67/0011 427/180 |
| 2011/0265980 A1 | * | 11/2011 | Kubo | H01L 23/373 165/185 |
| 2012/0180933 A1 | * | 7/2012 | Wiercinski | B32B 7/12 156/71 |
| 2015/0086780 A1 | * | 3/2015 | Kawamura | C09J 133/04 428/354 |

FOREIGN PATENT DOCUMENTS

| | | |
|---|---|---|
| JP | 50-25808 A | 3/1975 |
| JP | 60-122711 A | 7/1985 |
| JP | 61-012918 A | 1/1986 |
| JP | 61-275117 A | 12/1986 |
| JP | 05-166676 A | 7/1993 |
| JP | 11-100207 A | 4/1999 |
| JP | 2003-165715 A | 6/2003 |
| JP | 2004-123506 A | 4/2004 |
| JP | 2004-299937 A | 10/2004 |
| JP | 2008-156145 A | 7/2008 |

OTHER PUBLICATIONS

International Search Report issued in International Application No. PCT/JP2013/001350 with Date of mailing Jun. 11, 2013, with English Translation.

* cited by examiner

METHOD FOR PRODUCING GRAPHITE SHEET

RELATED APPLICATIONS

This application is a national phase of International Application No. PCT/JP2013/001350, filed on Mar. 5, 2013, which in turn claims the benefit of Japanese Application No. 2012-065003, filed on Mar. 22, 2012, the disclosures of which Applications are incorporated by reference herein.

TECHNICAL FIELD

The present invention relates to a manufacturing method of a graphite sheet to be used for various electronic devices.

BACKGROUND ART

In recent years, performance and transaction capacity of electronic devices are rapidly advancing, and an amount of heat emitted by electronic components such as semiconductor elements are increasing. To keep an operational performance and a reliability of the semiconductor elements and others, a thermal conductive sheet capable of conducting heat to a heat sink or the like is being employed. A pyrolytic graphite sheet is superior in conducting heat along a surface thereof and is used as the thermal conductive sheet. (see PLT 1, for example)

CITATION LIST

Patent Literature

PTL 1: Unexamined Japanese Patent Publication No. 2004-299937.

SUMMARY OF THE INVENTION

The present invention aims to provide a manufacturing method of a pyrolytic graphite sheet in a desired thickness.

The manufacturing method of the graphite sheet of the present invention includes: (A) producing a molded sheet; (B) producing a polyimide sheet; and (C) producing the graphite sheet. In (A), a cavity-forming sheet having a mesh structure or a nonwoven fabric structure is impregnated with polyamide acid, and the resultant is formed into the molded sheet. In (B), the molded sheet is heat-treated to imidize polyamide acid so as to produce the polyamide sheet composed of polyimide and a cavity-forming sheet disposed in polyimide. In (C), the polyimide sheet is fired in a non-oxidizing atmosphere to pyrolyze the polyimide so as to produce the graphite sheet. The cavity-forming sheet is made of material which maintains a shape thereof when the polyimide sheet is produced and which gasifies and loses at least 80% of its weight when the polyimide is pyrolyzed.

With this manufacturing method, decomposed material generated when the polyimide sheet is pyrolyzed is discharged outside the sheet through cavities formed by the cavity-forming sheet. Accordingly, even when a thick polyimide sheet is used, the polyimide sheet is not broken, the graphite sheet in a desired thickness can be manufactured without breakage.

DESCRIPTION OF EMBODIMENTS

Prior to explaining an exemplary embodiment of the invention, a problem of a conventional pyrolytic graphite sheet is explained. The pyrolytic graphite sheet is produced by pyrolyzing to graphitize a resin film such as a polyimide film. It is thus difficult to produce a thick pyrolytic graphite sheet. If resin film material is formed thick to get a thick pyrolytic graphite sheet, decomposition product generated during the pyrolyzation process is not thoroughly discharged out of the sheet but remains in the sheet. The remained substance gasifies during graphitization, swelling and destroying the sheet itself. For this reason, maximum thickness allowed to the conventional pyrolytic graphite sheet is about 100 μm.

Figure 1:
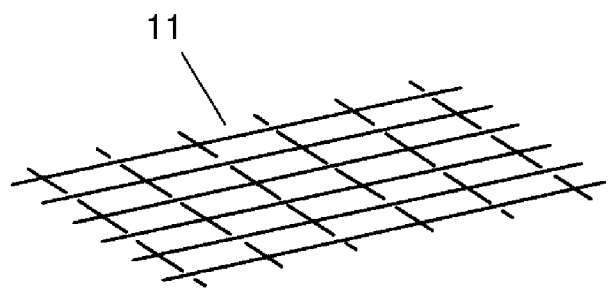
FIG. 1 is a schematic illustration of a cavity-forming sheet according to an exemplary embodiment of the invention.
Figure 2:
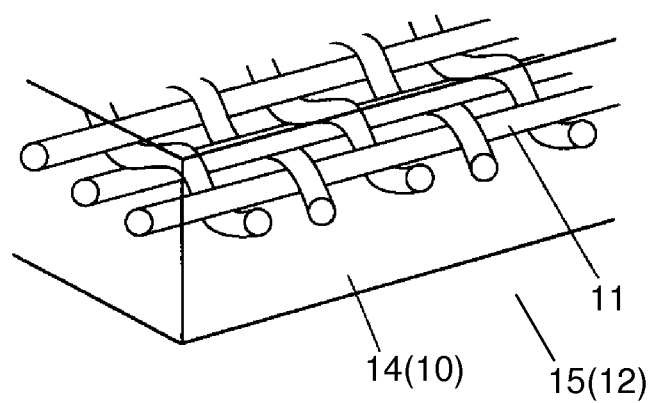
FIG. 2 is an illustration showing a constitution of a molded sheet and a polyimide sheet according to the exemplary embodiment of the invention.
Figure 3:
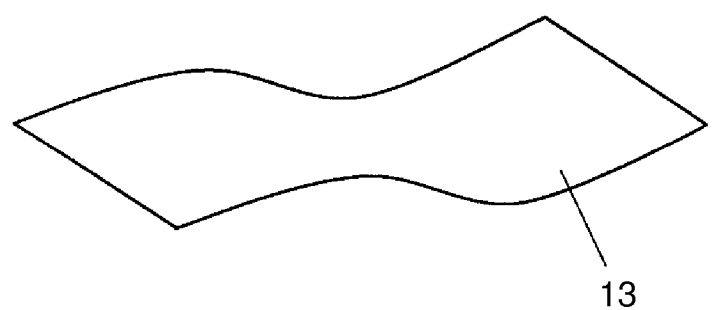
FIG. 3 is a schematic illustration of a graphite sheet according to the exemplary embodiment of the invention.

Hereinafter, a manufacturing method of a graphite sheet according to the exemplary embodiment of the present invention is described with reference to FIGS. 1 to 3. FIGS. 1 to 3 show the manufacturing method of the graphite sheet according to the exemplary embodiment of the present invention: FIG. 1 is a schematic illustration of cavity-forming sheet 11; FIG. 2 shows a configuration of a molded sheet and a polyimide sheet; and FIG. 3 is a schematic illustration of the graphite sheet.

First, polypropylene threads of about 20 μm in diameter are weaved into a mesh to produce cavity-forming sheet 11 as shown in FIG. 1.

Next, cavity-forming sheet 11 is impregnated with polyamide acid 14 as a precursor of polyimide and mold the resultant into a sheet as shown in FIG. 2. Thus formed molded sheet 15 is heat-treated at about 400° C. to imidize polyamide acid 14. As a result, polyimide sheet 12 composed of polyimide 10 and cavity-forming sheet 11 disposed in polyimide 10 is produced as shown in FIG. 2. In this process, polyamide acid 14 is molded in a sheet so that polyimide sheet 12 is formed into about 200 μm in thickness.

Polypropylene is softened but not pyrolyzed at the temperature for imidizing polyamide acid 14. Therefore, cavity-forming sheet 11 maintains the mesh structure. Namely, cavity-forming sheet 11 maintains the shape thereof when polyimide sheet 12 is produced.

Next, polyimide sheet 12 is fired to carbonize in a non-oxidizing atmosphere at about 1200° C., and then further fired at about 2800° C. With these firing processes, graphite sheet 13 of about 200 μm thick is obtained as shown in FIG. 3.

When polyimide sheet 12 is carbonized, polypropylene constituting cavity-forming sheet 11 is pyrolyzed at a temperature from 450° C. to 500° C., before polyimide sheet 12 is pyrolyzed. Polyimide 10 begins to be pyrolyzed at a temperature from 500° C. to 600° C. In this temperature rising process, polypropylene is almost 100% is gasified and disappears even in the non-oxidizing atmosphere. Accordingly, when polyimide sheet 12 begins to be pyrolyzed, cavities in the mesh structure are already formed in polyimide sheet 12.

Decomposition product (gas) generated when polyimide sheet 12 is pyrolyzed is discharged outside the sheet through the cavities. Therefore, the decomposition product is prevented from staying in the sheet during pyrolyzation of polyimide sheet 12. At least 50% of weight of polyimide 10 remains as carbon even after it is pyrolyzed, and other material remains scarcely. Therefore, graphite sheet 13 is manufactured by firing at about 2800° C.

After the graphitization, graphite sheet 13 might include some remained cavities where cavity-forming sheet 11 existed. Such cavities can be crushed by rolling graphite sheet 13 with a roller to tan graphite sheet 13, obtaining a flexible graphite sheet.

Cavity-forming sheet 11 may be formed of any material as long as it keeps a shape at the temperature for imidizing polyamide acid to produce polyimide sheet 12, and as long as it loses at least 80% of its weight when polyimide 10 is pyrolyzed. Accordingly, material other than polypropylene, such as polyethylene and polyethylene terephthalate may be employed singly or combined. Polypropylene and polyethylene are especially preferred because they disappear almost 100% at the pyrolyzation.

In considering the necessity of forming the cavities and maintaining a required strength after graphitization, the thread used for cavity-forming sheet 11 preferably has a diameter of at least 20 μm and at most 30 μm. The mesh opening size is preferred to be at least three times and at most five times of the thread diameter.

Cavity-forming sheet 11 may have a nonwoven fabric structure, instead of the mesh structure.

To manufacture a thicker pyrolytic graphite sheet, a plurality of cavity-forming sheets 11 can be employed. Namely, when cavity-forming sheet 11 is impregnated with polyamide acid 14 to produce molded sheet 15, a plurality of cavity-forming sheets 11 is impregnated with polyamide acid 14. In this case, a distance between two of the plurality of cavity-forming sheets 11 in polyimide sheet 12 is preferably 100 μm or less. With this arrangement, even when polyimide sheet 12 is thick, gas generated when polyimide 10 is pyrolyzed is discharged outside the sheet. Thus, graphite sheet 13 is manufactured in a desired thickness.

Meanwhile, it is preferable that cavity-forming sheet 11 is impregnated with polyamide acid 14 and molded into a sheet in a manner that cavity-forming sheet 11 is exposed to an edge face of polyimide sheet 12. Namely, cavity-forming sheet 11 is preferably exposed to the edge face of polyimide sheet 12 when polyimide sheet 12 is produced. If cavity-forming sheet 11 is exposed to the edge face of polyimide sheet 12, the decomposition product generated during pyrolyzation of cavity-forming sheet 11 is easily discharged.

INDUSTRIAL APPLICABILITY

With the manufacturing method of the graphite sheet of the invention, a pyrolytic graphite sheet having a superior thermal conductivity is obtained in a desired thickness, so the method is industrially useful.

REFERENCE MARKS IN THE DRAWINGS 10 polyimide
11 cavity-forming sheet
12 polyimide sheet
13 graphite sheet
14 polyamide acid
15 molded sheet

The invention claimed is:

1. A manufacturing method of a graphite sheet, the method comprising:
    producing a molded sheet by impregnating a cavity-forming sheet having a mesh structure or a nonwoven structure with polyamide acid, and molding the cavity-forming sheet impregnated with polyamide acid into a sheet;
    producing a polyimide sheet composed of polyimide and the cavity-forming sheet disposed in the polyimide by heat-treating the molded sheet to imidize the polyamide acid, and
    producing the graphite sheet by firing the polyimide sheet in a non-oxidizing atmosphere to pyrolyze the polyimide,
    wherein the cavity-forming sheet is composed of material which keeps a shape when the polyimide sheet is produced and which is gasified and loses at least 80% of weight when the polyimide is pyrolyzed.

2. The manufacturing method of a graphite sheet according to claim 1,
    wherein material for the cavity-forming sheet is at least one of polypropylene, polyethylene, and polyethylene terephthalate.

3. The manufacturing method of a graphite sheet according to claim 1,
    wherein the cavity-forming sheet is exposed to an edge face of the polyimide sheet when the polyimide sheet is produced.

4. The manufacturing method of a graphite sheet according to claim 1, further comprising:
    rolling the graphite sheet with a roller to tan the graphite sheet after the polyimide is pyrolyzed and the graphite sheet is produced.

5. The manufacturing method of a graphite sheet according to claim 1,
    wherein a thread composing the cavity-forming sheet is at least 20 μm and at most 30 μm in diameter.

6. The manufacturing method of a graphite sheet according to claim 1,
    wherein the cavity-forming sheet has the mesh structure and an opening of a mesh is at least 3 times and at most 5 times of a diameter of a thread composing the cavity-forming sheet.

7. The manufacturing method of a graphite sheet according to claim 1,
    wherein the cavity-forming sheet is one of a plurality of cavity-forming sheets,
    wherein, when the molded sheet is produced, the plurality of cavity-forming sheets is impregnated with polyamide acid, and
    a distance between two sheets of the plurality of cavity-forming sheets in the polyimide sheet is at most 100 μm.

* * * * *